United States Patent
Roohparvar et al.

[11] Patent Number: 6,016,561
[45] Date of Patent: Jan. 18, 2000

[54] OUTPUT DATA COMPRESSION SCHEME FOR USE IN TESTING IC MEMORIES

[75] Inventors: Fariborz F. Roohparvar, Cupertino; Allahyar Vahidi Mowlavi, Santa Clara, both of Calif.; Mark A. Hawes; Gregory L. Cowan, both of Boise, Id.

[73] Assignee: Micron Technology, Inc., Boise, Id.

[21] Appl. No.: 09/099,831

[22] Filed: Jun. 18, 1998

Related U.S. Application Data

[63] Continuation of application No. 08/681,527, Jul. 22, 1996, Pat. No. 5,787,097.

[51] Int. Cl.[7] .................................................. G01R 31/28
[52] U.S. Cl. ......................................... 714/720; 365/201
[58] Field of Search .................................... 714/722, 733, 714/720, 718, 715, 736, 738, 766, 756, 5, 42; 365/201, 230.03, 230.08, 189.05, 226, 189.07

[56] References Cited

U.S. PATENT DOCUMENTS

| | | | |
|---|---|---|---|
| 5,311,473 | 5/1994 | McClure et al. | 365/201 |
| 5,400,281 | 3/1995 | Morigami | 365/201 |
| 5,428,575 | 6/1995 | Fudeyasu | 365/201 |
| 5,436,910 | 7/1995 | Takeshima et al. | 371/21.1 |
| 5,526,364 | 6/1996 | Roohparvar | 371/22.1 |
| 5,557,574 | 9/1996 | Senoo et al. | 365/201 |
| 5,579,272 | 11/1996 | Uchida | 365/201 |
| 5,602,778 | 2/1997 | Futatsuya et al. | 365/185.09 |
| 5,604,710 | 2/1997 | Tomishima et al. | 365/201 X |
| 5,615,163 | 3/1997 | Sakui et al. | 365/230.03 |
| 5,629,898 | 5/1997 | Idei et al. | 365/222 |
| 5,723,990 | 3/1998 | Roohparvar | 327/81 |
| 5,787,097 | 7/1998 | Roohparvar et al. | 714/718 |

*Primary Examiner*—Hoa T. Nguyen
*Attorney, Agent, or Firm*—Schwegman, Lundberg Woessner & Kluth P.A.

[57] ABSTRACT

A memory system operable in a normal mode of operation and a test mode of operation includes sensing circuitry which generates x number of data bits during a read cycle. A read path circuit, coupled to the sensing circuitry, transfers the x number of data bits generated by the sensing circuitry during a first read cycle in the normal mode of operation to x number of output nodes. A first detection circuit, coupled to the read path circuit, detects whether or not the x number of data bits generated by the sensing circuitry during a second read cycle in the test mode of operation are arranged in a pattern in which all bits are identical. A second detection circuit, coupled to the read path circuit, detects whether or not the x number of data bits generated by the sensing circuitry during the second read cycle in the test mode of operation are arranged in a pattern in which each two adjacent bits are different. An output circuit, coupled to the first and second detection circuits, generates y number of output data bits which are arranged in a pattern indicative of whether the x number of data bits generated by the sensing circuitry during the second read cycle in the test mode of operation are identical, are arranged in a pattern in which each two adjacent bits are different, or are arranged in another pattern, and wherein y is less than x. A method of testing an integrated circuit (IC) memory is also disclosed.

35 Claims, 10 Drawing Sheets

OUTPUT DATA COMPRESSION SCHEME FOR USE IN TESTING IC MEMORIES

This application is a continuation of U.S. patent application Ser. No. 08/681,527, filed Jul. 22, 1996 now U.S. Pat. No. 5,787,097.

BACKGROUND OF THE INVENTION

1. Field of the Invention

The present invention relates to the testing of integrated circuit (IC) memories, and more particularly, to IC memories having circuitry which, during a test mode of operation, compresses the number of output data bits to fewer than the number of data bits used during the normal mode of operation.

2. Description of the Related Art

As the geometries and cost of integrated circuit memories continues to be reduced, the costs associated with testing the memories is becoming a more significant component of the total manufacturing cost. Specifically, before delivery to end users, each memory chip must be tested to ensure that it is functioning properly.

For example, referring to FIG. 1, a memory chip 20 having 16 data lines DQ[15:0] is connected to a memory chip tester 22 that has at least 16 I/O lines I/O[15:0]. A common testing procedure is to first have the tester 22 send a command to the memory chip 20 to erase all of its bits to "1". The tester 22 then reads the data lines DQ[15:0] in order to verify that they are all "1". Next, zeros are written to all of the bits of the memory chip 20 and the data lines DQ[15:0] are read in order to verify that they are all "0". Then, all of the bits of the memory chip 20 are erased, a checker board pattern "0101010101010101" is written to the memory chip 20, and the data lines DQ[15:0] are read in order to verify that the checker board pattern is present on the data lines. Finally, all of the bits of the memory chip 20 are erased, an inverted checker board pattern "1010101010101010" is written to the memory chip 20, and the data lines DQ[15:0] are read in order to verify that the inverted checker board pattern is present on the data lines. This testing procedure is a good way to find out if any of the bits of the memory chip 20 are shorted to an adjacent bit, to a high level or to a low state, or if there are any other problems.

Memory testers have a limited number of I/O pins, e.g., 32, 64, 128, etc. When memory chips are connected to a tester in the manner shown in FIG. 1, a memory tester having 64 I/O pins can simultaneously test four, 16 bit memory chips. This is because each one of the four memory chips requires 16 of the tester's I/O lines in order for the tester to separately read each of the four memory chips.

Because the cost of testing is becoming such a significant component of the total manufacturing cost of memory chips, it would be desirable to somehow increase the number of memory chips which can be simultaneously tested with a single tester so as to reduce the per chip cost of testing.

SUMMARY OF THE INVENTION

The present invention provides a memory system operable in a normal mode of operation and a test mode of operation. The memory system includes sensing circuitry which generates x number of data bits during a read cycle. A detection circuit detects a first pattern among the x number of data bits. An output circuit generates y number of output data bits, which is less than the x number, which are arranged in a second pattern which is indicative of the first pattern detected by the detection circuit. A read path circuit, coupled to the sensing circuitry, the detection circuit and the output circuit, transfers the x number of data bits to x number of output nodes in a first read cycle operating in the normal mode of operation. The read path circuit also transfers the y number of output data bits to y number of output nodes in a second read cycle operating in the test mode of operation.

The present invention also provides a memory system operable in a normal mode of operation and a test mode of operation. The memory system includes sensing circuitry which generates x number of data bits during a read cycle. A read path circuit, coupled to the sensing circuitry, transfers the x number of data bits generated by the sensing circuitry during a first read cycle in the normal mode of operation to x number of output nodes. A first detection circuit, coupled to the read path circuit, detects whether or not the x number of data bits generated by the sensing circuitry during a second read cycle in the test mode of operation are arranged in a pattern in which all bits are identical. A second detection circuit, coupled to the read path circuit, detects whether or not the x number of data bits generated by the sensing circuitry during the second read cycle in the test mode of operation are arranged in a pattern in which each two adjacent bits are different. An output circuit, coupled to the first and second detection circuits, generates y number of output data bits which are arranged in a pattern indicative of whether the x number of data bits generated by the sensing circuitry during the second read cycle in the test mode of operation are identical, are arranged in a pattern in which each two adjacent bits are different, or are arranged in another pattern, and wherein y is less than x.

The present invention also provides a pattern recognition circuit which includes a first detection circuit which detects whether or not a set of x number of data bits are arranged in a pattern in which all of the x number of data bits are identical and which generates a MATCH signal in response thereto. An output circuit, coupled to receive the MATCH signal, generates y number of output data bits which are arranged in a pattern indicative of whether the set of x data bits are identical or are arranged in another pattern, wherein the y number is less than the x number.

The present invention also provides a method of testing an integrated circuit (IC) memory. The method includes the steps of: reading x number of outputs of sensing circuitry in the IC memory so that x number of data bits are read; detecting a first pattern among the x number of data bits which are read; and generating a y number of output data bits which is less than the x number and which are arranged in a second pattern which is indicative of the first pattern among the x number of data bits.

The present invention also provides a memory system operable in a normal mode of operation and a test mode of operation. The memory system includes sensing circuitry which generates x number of data bits during a read cycle. A detection circuit detects a first pattern among the x number of data bits. An output circuit generates y number of output data bits, which is less than the x number, which are arranged in a second pattern which is indicative of the first pattern detected by the detection circuit. An x number of output drivers correspond to the x number of data bits generated by the sensing circuitry. During the test mode of operation only y number of the x number of output drivers are enabled and are used to transfer the y number of output data bits to y number of output nodes.

The present invention also provides a memory test system which includes a memory tester and a plurality of memories coupled to the memory tester. Each of the memories includes x number of output nodes, sensing circuitry configured to generate x number of data bits, and a compression circuit operatively coupled to the sensing circuitry and configured to compress the x number of data bits to a lower y number of output bits so that data represented by the x number of data bits can be represented on only y number of the x number of output nodes.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 2:
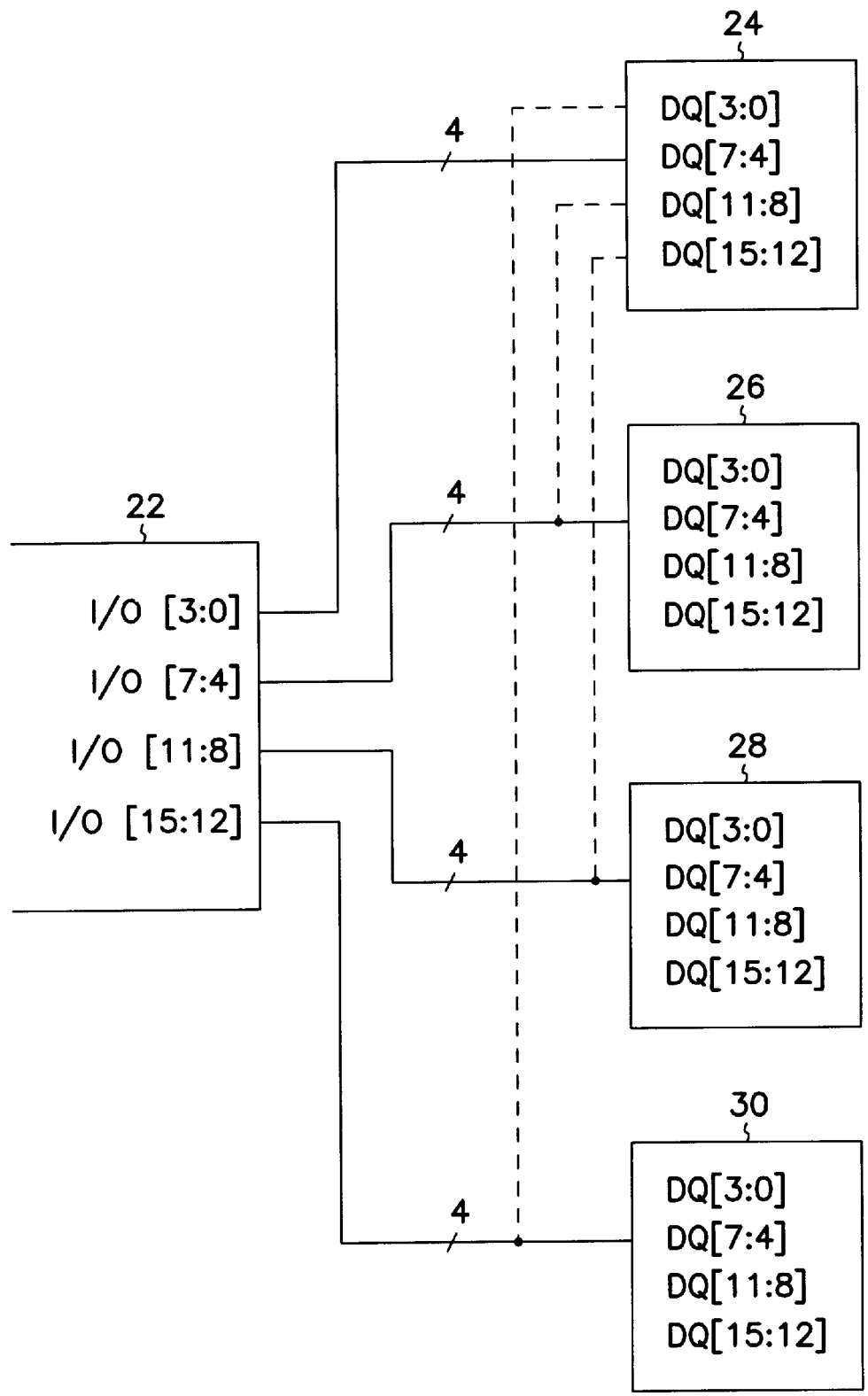
FIG. 2 is a block diagram illustrating memory chips in accordance with the present invention connected to a memory chip tester.

Referring to FIG. 2, there is illustrated four memory chips 24, 26, 28, 30 in accordance with the present invention. In general, in order to maximize the number of parts that can be tested in parallel, i.e., simultaneously, by the tester 22, each of the memory chips 24, 26, 28, 30 is placed in a special I/O compression test mode in which the number of active output pins on the memory chips 24, 26, 28, 30 is reduced and the remaining output drivers are tri-stated. In other words, when the memory chip 24 is in the I/O compression test mode and is being read, i.e., the memory chip 24 is outputting data, fewer than all of its 16 data pins are active.

As will be discussed below, circuitry inside each of the memory chips 24, 26, 28, 30 which is enabled during the I/O compression test mode "compresses" the data which is normally output on all 16 data pins down to fewer than 16 data pins. During the I/O compression test mode, the active output drivers output a pre-processed data that make it possible for a tester to verify the pass/fail status of specific patterns at different address locations. Thus, when the memory chip 24 is tested, information which is normally represented on all 16 of the data pins during the normal user mode of operation is represented on fewer than 16 pins during the I/O compression test mode. Using this compressed data, the tester is still able to extract enough information to detect failing patterns. It should be noted that the data compression takes place only when the data pins of the memory chips 24, 26, 28, 30 are in the output mode. When the memory chips 24, 26, 28, 30 are being written to, i.e., their data pins are in the input mode, all of the data pins DQ[15:0] remain active (except for program command purposes, which will be discussed below).

As mentioned above, I/O compression takes place during a special test mode of operation which is not a normal user mode of operation. One method for placing the memory system into a test or special mode of operation is described in U.S. Pat. No. 5,526,364, entitled, "Apparatus for Entering and Executing Test Mode Operations for Memory", granted Jun. 11, 1996, the contents of which is hereby incorporated in full by reference.

Figure 9:
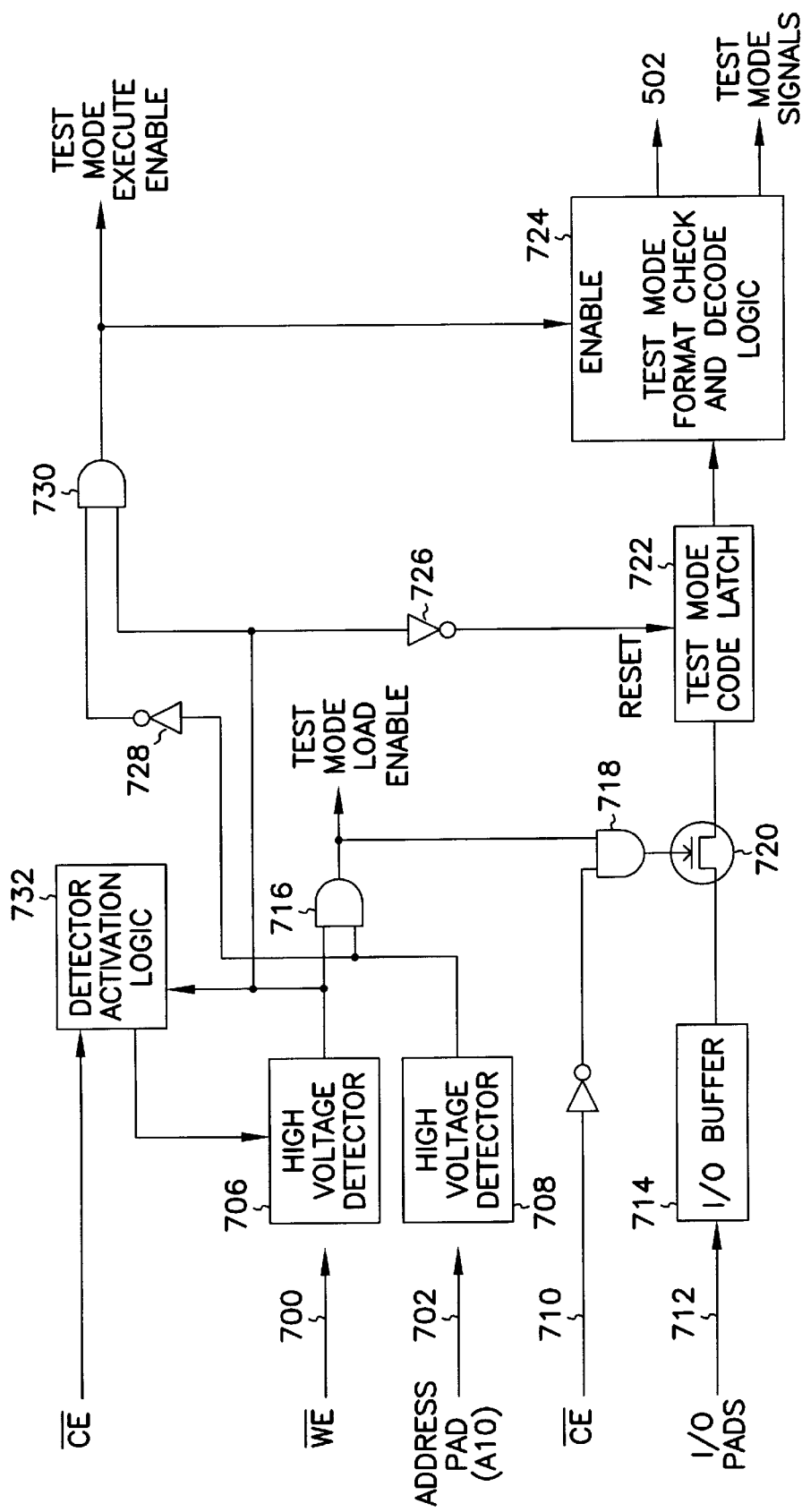
FIG. 9 is a schematic diagram illustrating a circuit for a detector/decoder which can be incorporated into the memory chips shown in FIG. 2 and used for entering the I/O compression test mode of operation.
Figure 10:
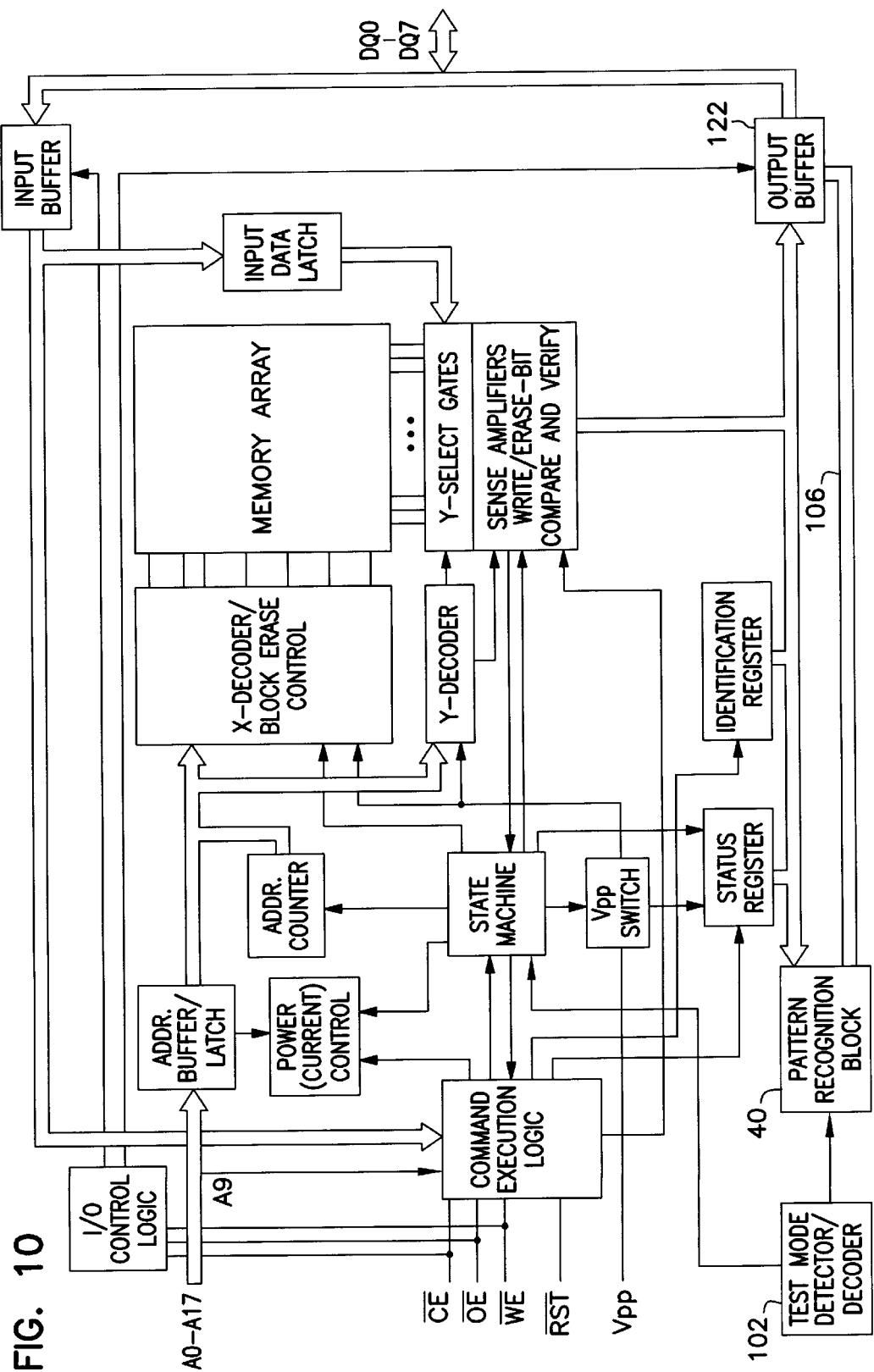
FIG. 10 is a functional block diagram illustrating a memory system which includes the I/O compression pattern recognition block shown in FIG. 4 and the detector/decoder shown in FIG. 9.

FIG. 9 is a schematic of a circuit for a detector/decoder (see element 102 of FIG. 10) which can be incorporated into a memory system and used for entering the I/O compression test mode of operation. In order to place the memory system into such a test mode of operation, the test mode must be entered and the appropriate test mode command signals must be applied to the data I/O terminals of the memory.

Typically, the end user of the memory system would have no reason to cause the memory system to enter a test or special mode of operation since this mode is intended to be used by test engineers at the memory fabrication facility. Furthermore, accidental entry into such a mode is to be avoided since the memory could be rendered permanently inoperable in this mode. Thus, the test mode entry circuitry of FIG. 9 is designed to reduce the likelihood of accidental entry into the mode by requiring simultaneous application of high voltages to multiple memory system terminals.

The circuit of FIG. 9 is activated by application of a high voltage to two or more terminals 700 and 702 of the memory system from an external source. These terminals are non-dedicated terminals used during normal memory operations. Terminals 700 and 702 may include, for example, address terminal (pad) A10 and the write enable terminal $\overline{WE}$. The magnitude of the high voltage applied to terminals 700 and 702 is chosen to be outside of the range of voltages which would typically be applied to those terminals during use of the terminals in normal (non-test mode) operation of the memory system. This is done to prevent an end user from unintentionally entering the test or special mode. The high voltage applied to terminals 700 and 702 is detected by detectors 706 and 708. A detector circuit suited for use in constructing detectors 706 and 708 is described in U.S. patent application Ser. No. 08/493,162, entitled, "Integrated Circuit Having High Voltage Detection Circuit", filed Jun. 21, 1995, the contents of which is hereby incorporated in full by reference.

After application of the high voltage to terminals 700 and 702, a signal on another terminal 710, in this case the chip enable $\overline{CE}$ terminal, is made active (low). Code signal data corresponding to one of several possible test or special modes is placed on the data I/O terminals 712 of the memory system and forwarded to an I/O buffer 714. In the present case, code data corresponding to an I/O compression test mode would be input.

An AND gate 716 provides a test mode load enable signal when the outputs of both high voltage detectors 706 and 708 indicate that an appropriate high voltage is being applied to terminals 700 and 702. The load enable signal is coupled to one input of an AND gate 718 together with an inverted signal $\overline{CE}$. This causes AND gate 718 to turn on pass transistor 720 which forwards the test or special mode code data entered by means of I/O pads 712 to buffer 714 and then to a test mode code latch 722. Separate I/O terminals and pass transistors 720 are used for each bit of input test or special mode data so that the data will be loaded into latch 722 in parallel. Typically there are a total of eight bits of test code data so that latch 722 will contain eight bits. Signal $\overline{CE}$ is then brought back to a high state, thereby latching the code data in latch 722.

After latch 722 has been loaded with the code data, one of the high input voltages, such as the input to address A10 terminal 702 is removed so that the output of detector 708 will go low thereby providing a high input to an AND gate 730 by way of inverter 728. Since the remaining input of gate 730, the output of the second high voltage detector 706, will still be high, gate 730 will produce a test or special mode enable signal. Among other things, this will enable a Test Mode and Format Check and Decode Logic unit 724 which will verify that the data in latch 722 corresponds to a proper test or special mode. In addition, unit 724 will decode the mode code to determine which one of approximately fifteen different special or test modes has been entered. These modes each have an associated mode signal which is produced by the Test Mode and Format Check and Decode Logic unit 724 and which is used by the memory system in combination with other signals for carrying out the various test or special mode functions.

The system will remain in the selected mode as long as the voltage applied to terminal 700 remains high. When signal $\overline{CE}$ is brought back to a high state, detector activation logic 732 keeps detector circuits 704 and 706 enabled as long as the voltage applied to terminal 700 remains high. During the course of carrying out the various test or special mode operations, it may be necessary to periodically change the state of the chip enable $\overline{CE}$ signal. However, since address A10 on line 702 has been shifted to a low state, the low output of AND gate 718 will prevent any change in the contents of mode code latch 722. Once the test or special mode of operation is completed, the high voltage applied to terminal 700 is removed, thereby causing the output of AND gate 730 to go low and end the test or special mode of operation.

The test mode codes loaded into latch 722 are preferably of a specific format which further reduces the possibility of accidental entry into a test mode. The mode code is typically divided into two groups of bits, with the first group of bits, the format bits, signifying a test or special mode of operation and the remaining bits signifying a particular one of the modes. A description of a code format suited for use with the present invention can be found in the previously mentioned U.S. Pat. No. 5,526,364.

In the embodiment of the invention described herein, the number of output pins in the memory chips 24, 26, 28, 30 which remain active during the I/O compression test mode are the 4 data pins DQ[7:4]. This permits the four 16 bit memory chips 24, 26, 28, 30, rather than just the single memory chip 20 shown in FIG. 1, to be simultaneously tested by the single tester 22 having 16 I/O pins. Four data pins were chosen because certain flash memory chips, such as the memory chips 24, 26, 28, 30, require at least 4 I/O pins to pass the basic write commands, such as for example, program, erase, erase suspend and status read. Furthermore, 4 I/O pins are needed to monitor the status register in each of the memory chips 24, 26, 28, 30 during write operations. It should be well understood, however, that the number of active output pins on the memory chips 24, 26, 28, 30 may be reduced to a number greater than or less than 4 in accordance with the present invention. A general principle of the present invention is that, during a test mode, the number of active output pins on a memory chip, regardless of the total number of output pins on the memory chip, is reduced to a number less than the total number. For example, it is envisioned that the number of active output pins on a memory chip could be reduced to just 2 pins. By reducing the number of active output pins, a greater number of memory chips can be connected to and simultaneously tested by a single tester.

In order to simplify the following discussion, it will be assumed that the tester 22 has only 16 I/O pins I/O[15:0]. However, it should be well understood that the principles of the present invention apply to memory chip testers having any number of I/O pins. For example, for the scenario discussed herein where a memory chip has 4 active outputs during I/O compression test mode, a tester having 32 I/O pins could simultaneously test eight 16 bit memory chips, a tester having 64 I/O pins could simultaneously test sixteen 16 bit memory chips, etc.

The memory chips 24, 26, 28, 30 are connected to the tester 22 by connecting the active output pins DQ[7:4] of each memory chip 24, 26, 28, 30 to separate I/O pins on the tester 22, as shown. Such a connection gives the tester 22 the ability to simultaneously read the data on the active output pins DQ[7:4] of each memory chip 24, 26, 28, 30.

The other pins DQ[3:0, 15:8] of each memory chip 24, 26, 28, 30 are connected to the remaining pins of the tester 22 for which no connection has been made for that particular memory chip. For example, with respect to the memory chip 24, as shown in the dashed lines in FIG. 2, the data pins DQ[3:0] are connected to the I/O pins I/O [15:12], the data pins DQ[11:8] are connected to the I/O pins I/O [7:4], and the data pins DQ[15:12] are connected to the I/O pins I/O [11:8]. Although not shown in FIG. 2 in order to simplify the drawing, similar connections are made to each of the other memory chips 26, 28, 30.

Such connections result in each I/O pin of the tester 22 being connected to more than one memory chip; e.g., four memory chips in the scenario shown in FIG. 2. This is not a problem, however. Specifically, during a write operation, i.e., the tester 22 is writing to the memory chips 24, 26, 28, 30, it is permissible for each I/O pin of the tester 22 to write to more than one of the memory chips 24, 26, 28, 30. However, during a read operation, i.e., the tester 22 is reading the memory chips 24, 26, 28, 30, each I/O pin of the tester 22 can read only one pin of one of the memory chips 24, 26, 28, 30. Because during a read operation, as discussed above, only the data pins DQ[7:4] of each memory chip 24, 26, 28, 30 are active, and the data pins DQ[7:4] of each memory chip 24, 26, 28, 30 are connected to separate I/O pins on the tester 22, each I/O pin of the tester 22 is in fact reading only one pin of one of the memory chips 24, 26, 28, 30. Again, during a write operation, all of the data pins DQ[15:0] of each memory chip 24, 26, 28, 30 are active, but during a read operation, only the four data pins DQ[7:4] of each memory chip 24, 26, 28, 30 are active.

It should be noted that a write operation is preceded by a four bit program command. As mentioned above, when in the I/O compression test mode all of the data pins DQ[15:0] of each of the memory chips 24, 26, 28, 30 are active during a write operation. However, in the I/O compression test mode, only the data pins DQ[7:4] of each of the memory chips 24, 26, 28, 30 are active for program command purposes. This is because in the normal user mode of operation the memory chips 24, 26, 28, 30 receive program commands in data pins DQ[7:4] and data pins [15:8, 3:0] are all "0". In the I/O compression test mode scenario shown in FIG. 2, however, the tester 22 will send out the same program command on each set of the four sets of output lines I/O [3:0], I/O [7:4], I/O [11:8], I/O [15:12] so that each of the memory chips 24, 26, 28, 30 receives the program command at its data pins DQ[7:4]. But due to the connections shown in FIG. 2, the other data pins DQ[15:8, 3:0] of each of the memory chips 24, 26, 28, 30 will also receive the program command. Therefore, in the I/O compression test mode, the memory chips 24, 26, 28, 30 will look only at the data pins DQ[7:4] for program command purposes so that the program commands are properly received.

Figure 1:
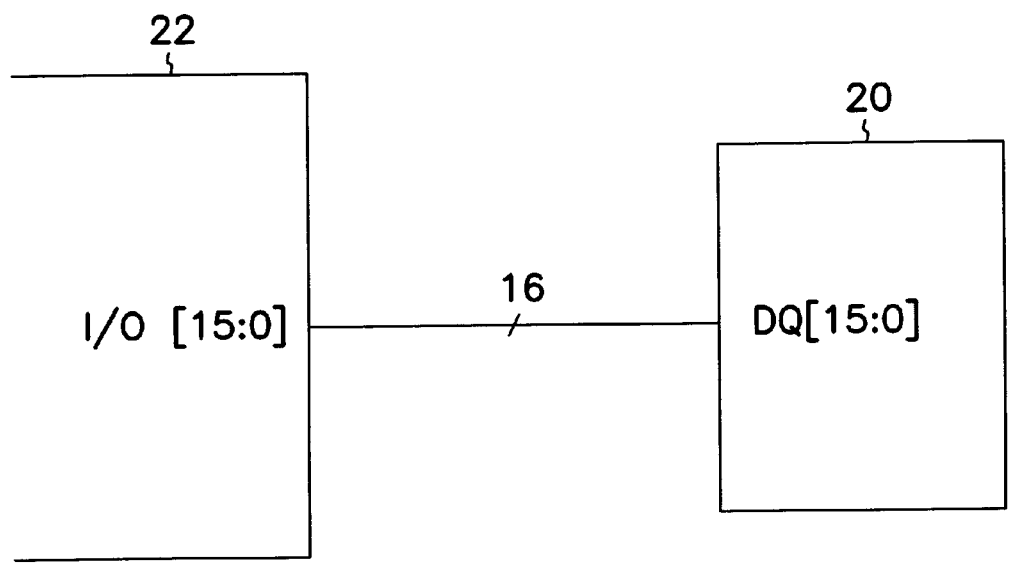
FIG. 1 is a block diagram illustrating a prior art memory chip connected to a memory chip tester.
Figure 3:
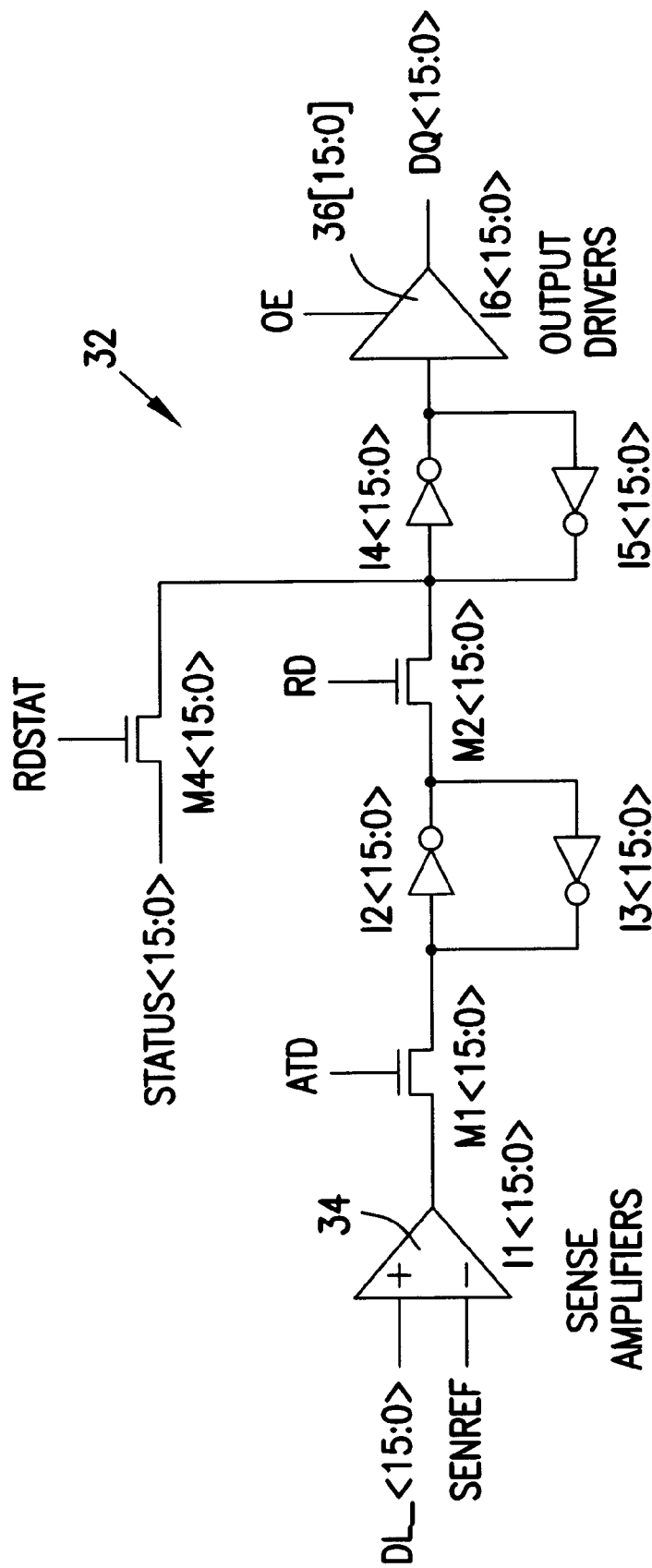
FIG. 3 is a schematic diagram illustrating a prior art memory chip read path.

FIG. 3 shows a typical read path 32 for a conventional memory chip, such as the memory chip 20 shown in FIG. 1. During a normal array read operation, i.e., when an external device connected to DQ[15:0] is reading the memory, the RD signal is switched to "1" in order to turn on the pass gates M2[15:0] and the RDSTAT signal is switched to "0" in order to turn off the pass gates M4[15:0]. Data is passed from the sense amplifiers 34 to the output drivers 36, which are enabled by the enable signal OE. During a status register read operation, the RD signal is switched to "0" in order to turn off the pass gates M2[15:0] and the RDSTAT signal is switched to "1" in order to turn on the pass gates M4[15:0]. Status data is passed from the status lines Status[15:0] to the output drivers 36.

Figure 4:
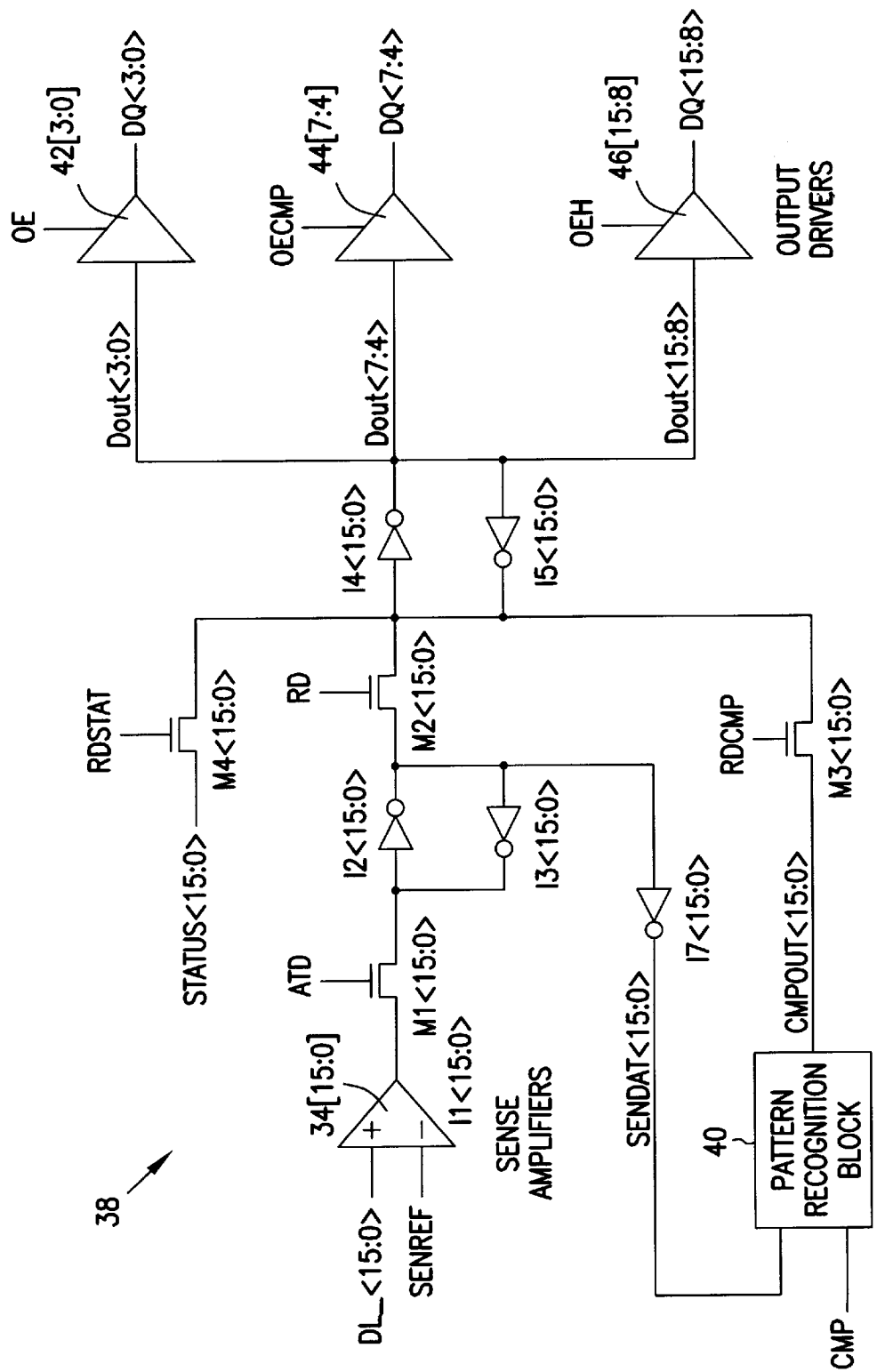
FIG. 4 is a schematic diagram illustrating a memory chip read path in accordance with the present invention.

FIG. 4 shows a read path 38 in accordance with the present invention which is embodied in each of the memory chips 24, 26, 28, 30. The read path 38 includes the circuitry which compresses the data which is normally output on all 16 data pins down to fewer than 16 data pins during the I/O compression test mode. The read path 38 has a pattern recognition block 40 added across the pass gates M2[15:0]. The purpose of the pattern recognition block 40 is to receive the data sendat[15:0] which comes from the sense amplifiers 34 and compress that data down to 4 bits. Although the output CMPOUT[15:0] of the pattern recognition block 40 is 16 bits wide, the result of the compression performed by the pattern recognition block 40 is embodied in the 4 bits CMPOUT[7:4]. These 4 bits are inverted and then output on the 4 active output pins DQ[7:4]. The CMP signal enables the pattern recognition block 40.

During a normal array read operation the RD signal is switched to "1" in order to turn on the pass gates M2[15:0], and the RDCMP and RDSTAT signals are switched to "0" in order to turn off the pass gates M3[15:0], M4[15:0]. During a status register read operation, the RDSTAT signal is switched to "1" in order to turn on the pass gates M4[15:0], and the RD and RDCMP signals are switched to "0" in order to turn off the pass gates M2[15:0], M3[15:0]. During an array read operation in the I/O compression test mode, the RDCMP signal is switched to "1" in order to turn on the pass gates M3[15:0], and the RD and RDSTAT signals are switched to "0" in order to turn off the pass gates M2[15:0], M4[15:0]. Furthermore, the CMP signal is switched to "1" in order to enable the pattern recognition block 40.

The pass gates M3[15:0] connect the output CMPOUT [15:0] through inverters I4[15:0] to the output drivers, which is split into 3 components 42 [3:0], 44[7:4], 46[15:8]. Inverters I5[15:0], I3[15:0] are weak inverters for ensuring that the inputs of inverters I4[15:0], I2[15:0], respectively, are at CMOS levels. The purpose of having 3 separate output driver components 42 [3:0], 44[7:4], 46[15:8] is to have more than one output driver enable signal, such as for example, the enable signals OE, OECMP, OEH for the drivers 42[3:0], 44[7:4], 46[15:8], respectively. Alternatively, the enable signals OE and OEH may be set equal to each other so that there are only two separate enable signals. During the I/O compression test mode, the enable signal OECMP is "1" to enable the output driver 44[7:4] so that the 4 data pins DQ[7:4] are active, and the enable signals OE and OEH are "0" to keep the output drivers for DQ[15:8] and DQ[3:0] deselected, or tri-stated.

Figure 5:
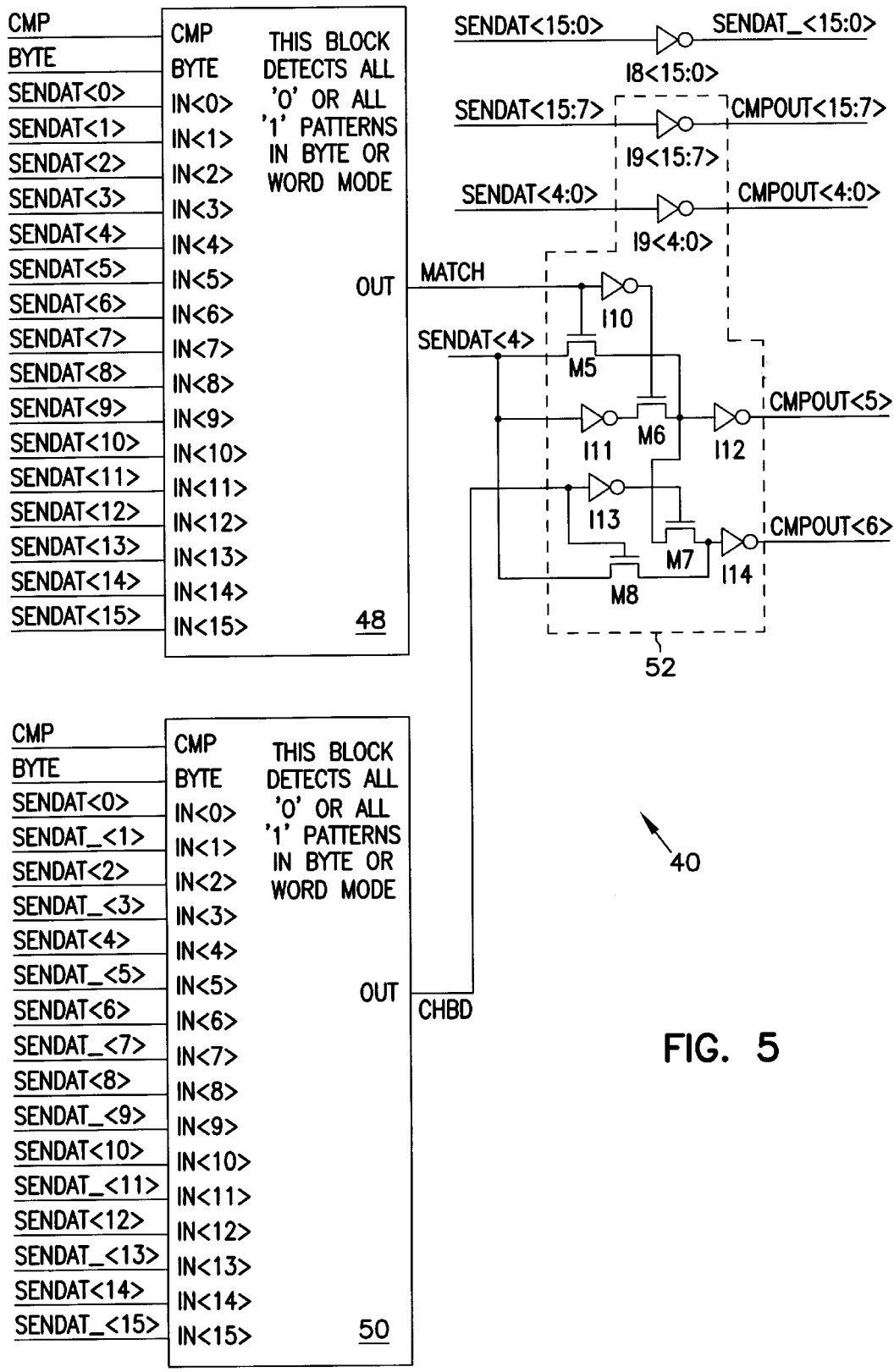
FIG. 5 is a schematic diagram illustrating the pattern recognition block shown in FIG. 4.

Referring to FIG. 5, the pattern recognition block 40 includes detection blocks 48, 50, output logic 52, and inverters I8[15:0]. Four patterns are detected by the pattern recognition block 40: (1) all "0"; (2) all "1"; (3) checker board "0101010101010101"; and (4) inverted checker board "1010101010101010". Although only these four patterns are detected, it should be well understood that other patterns could be detected as well.

The purpose of the detection blocks 48, 50 is to detect patterns among the data bits sendat[15:0], i.e., detect patterns in which the data bits sendat[15:0] are arranged. Specifically, the purpose of the detection block 48 is to detect when the data lines sendat[15:0] are either all "0" or all "1". When either all "0" or all "1" is detected, the MATCH output goes to "1"; otherwise, the MATCH output remains at "0". The purpose of the detection block 50 is to detect when the data lines sendat[15:0] are in either the checkerboard or inverted checkerboard pattern. When either the checkerboard or inverted checkerboard pattern is detected, the CHBD output goes to "1"; otherwise, the CHBD output remains at Each of the detection blocks 48, 50 includes CMP and BYTE inputs. A "1" on the CMP inputs turns on the detection blocks 48, 50. The purpose of the BYTE inputs is to select that the detection be done in either byte mode (BYTE="1") or word mode (BYTE="0"). By using word mode the reading of the data will be done in one-half the time it takes to do it in byte mode.

The circuitry inside the detection blocks 48, 50 is the same. What differs between the two blocks 48, 50 are the inputs that are used. Specifically, the match detection block 48 receives sendat[15:0], and the checkerboard detection block 50 receives, in alternating order, sendat[0, 2, 4, 6, 8, 10, 12, 14] and sendat_[1, 3, 5, 7, 9, 11, 13, 15]. The basic function of the circuitry inside both of the detection blocks 48, 50 is to detect all "0" or all "1" patterns. By inverting every other bit of sendat[15:0], i.e., applying sendat_[1, 3, 5, 7, 9, 11, 13, 15], the checkerboard detection block 50 is able to detect the checkerboard or inverted checkerboard pattern in sendat[15:0].

Figure 6:
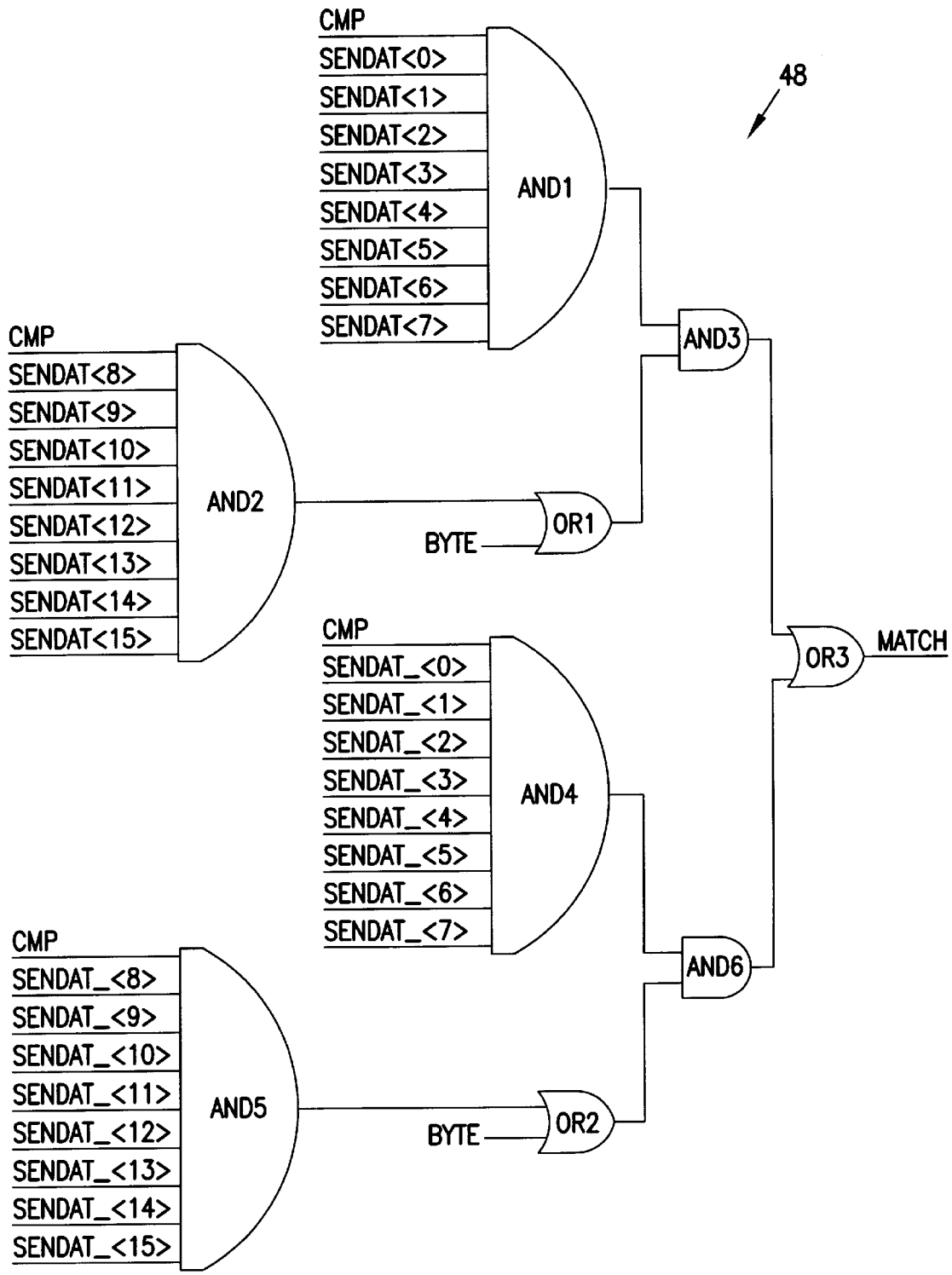
FIG. 6 is a schematic diagram illustrating one embodiment of one of the detection blocks shown in FIG. 4.
Figure 7:
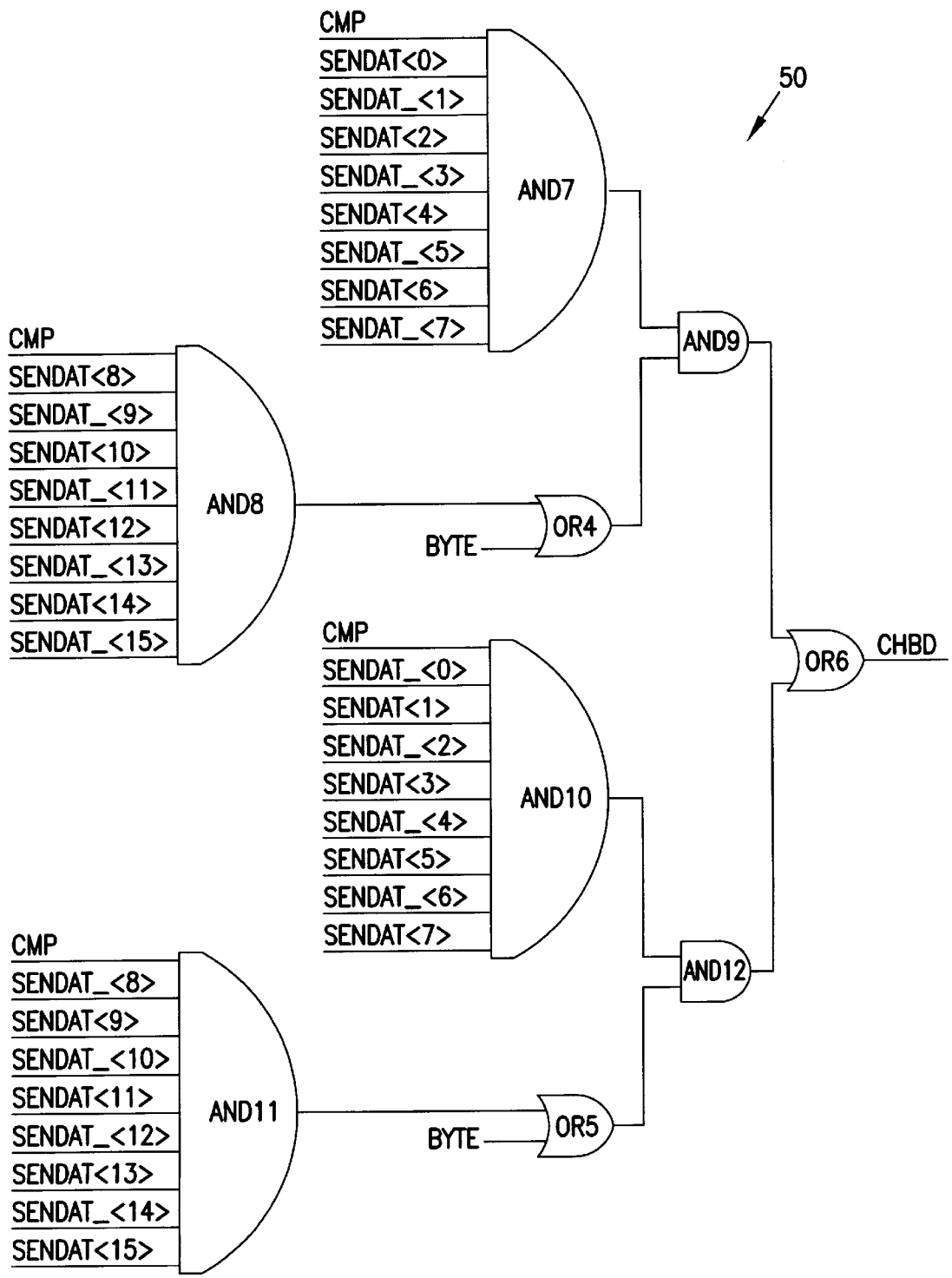
FIG. 7 is a schematic diagram illustrating one embodiment of the other detection block shown in FIG. 4.

The function of the detection blocks 48, 50 is best illustrated by the logic circuitry shown in FIGS. 6 and 7. In FIG. 6, word mode is selected when BYTE is "0" because this allows the output of AND2 to pass through OR1 and go to AND3, and the output of AND5 to pass through OR2 and go to AND6. Byte mode is selected when BYTE is "1" because this causes a "1" to be sent to one input of AND3 and a "1" to be sent to one input of AND6; therefore, the outputs of AND3 and AND6 are determined only by the outputs of AND1 and AND4, respectively. In other words, when BYTE is "1", AND2 and AND5 are bypassed.

AND1 detects when sendat[7:0]="11111111", and AND2 detects when sendat[15:8]="11111111". Therefore, the output of AND3 will be "1" in the following cases: 1) sendat [7:0]="11111111" and BYTE="1"; or 2) sendat[15:0]= "1111111111111111" and BYTE="0". Specifically, assuming that word mode has been selected, the outputs of AND1 and AND2 will be "1" only if CMP is "1" and sendat[15:0] are all "1". When this occurs, the output of AND3 is "1" which causes MATCH to be "1". Similarly, when CMP is "1", AND4, AND5, AND6 and OR2 detect when sendat[7:0]="00000000" in byte mode and when sendat[15:0]="0000000000000000" in word mode. Specifically, assuming that word mode has been selected, the outputs of AND4 and AND5 will be "1" only if CMP is "1" and sendat_[15:0] are all "1", which means that sendat [15:0] are all "0". When this occurs, the output of AND6 is "1" which causes MATCH to be "1". Thus, when MATCH= "1", i.e., OR3 output="1", the sense amplifiers 34 (See FIG. 4) are reading all "1" or all "0" patterns.

In FIG. 7, word and byte modes are selected in the same manner as in FIG. 6. The output of OR6 will be "1" in the following cases: 1) BYTE="1" and sendat[7:0]= "10101010"; 2) BYTE="0" and sendat[15:0]= "1010101010101010". Specifically, assuming that word mode has been selected, the outputs of AND7 and AND8 will be "1" only if CMP is "1", sendat[0, 2, 4, 6, 8, 10, 12, 14] are all "1", and sendat[1, 3, 5, 7, 9, 11, 13, 15] are all "0". When this occurs, the inverted checkerboard pattern has been detected and the output of AND9 is "1" which causes CHBD to be "1". The output of OR6 will also be "1" in the following cases: 1) BYTE="1" and sendat[7:0]= "0101010101"; and 2) BYTE="0" and sendat[15:0]= "0101010101010101". Specifically, assuming that word mode has been selected, the outputs of AND10 and AND11 will be "1" only if CMP is "1", sendat[0, 2, 4, 6, 8, 10, 12, 14] are all "0", and sendat[1, 3, 5, 7, 9, 11, 13, 15] are all "1". When this occurs, the checkerboard pattern has been detected and the output of AND12 is "1" which causes CHBD to be "1". Thus, when CHBD="1", i.e., OR6="1", the sense amplifiers 34 (See FIG. 4) are reading either the checker board or inverted checker board pattern.

Figure 8:
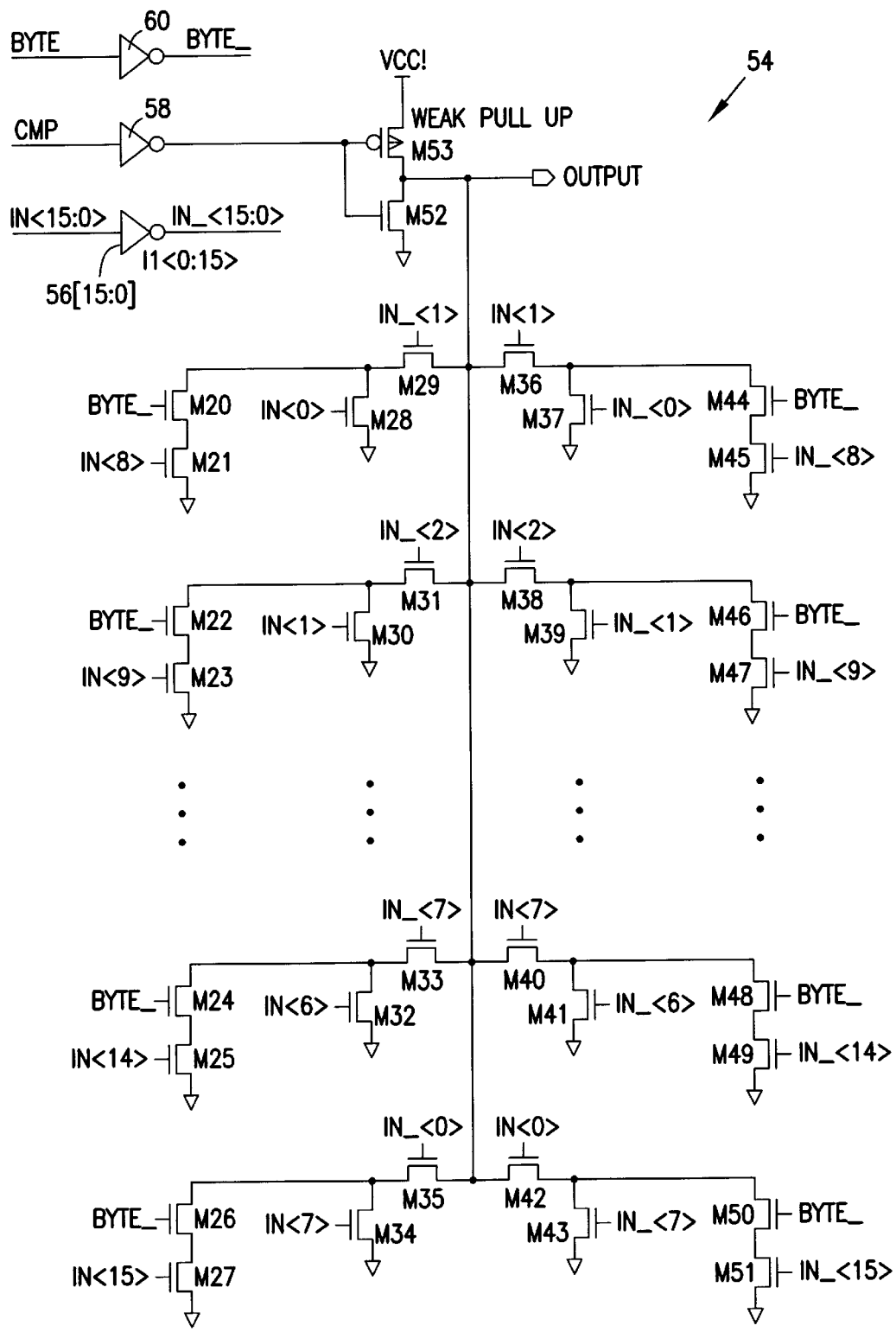
FIG. 8 is a schematic diagram illustrating another embodiment of the detection blocks shown in FIG. 4.

Although the logic circuitry shown in FIGS. 6 and 7 plainly illustrates the function of the detection blocks 48, 50, the circuitry 54 shown in FIG. 8 is a more practical circuit implementation of the detection blocks 48, 50. Specifically, the OUTPUT signal in the circuit 54 corresponds to either the MATCH or CHBD signals, depending upon whether the circuit 54 is being discussed in terms of the match detection block 48 or the checkerboard detection block 50, respectively. It should be noted that the circuit 54 will be the same for both the detection blocks 48, 50, but that the specific connections made to IN[15:0] will differ for each detection block 48, 50. Specifically, sendat[15:0] will be connected to IN[15:0] for the detection block 48, 50 in the manner shown in FIG. 5.

Whether the circuit 54 is used in the detection block 48 or 50, the basic function of the circuit 54 is the same. Specifically, if the enable signal CMP is "1" so that the circuit 54 is enabled, the OUTPUT signal will be "1" if the inputs IN[15:0] are either all "0" or all "1". If the inputs IN[15:0] are not all "0" or all "1", however, the OUTPUT signal will be "0". Furthermore, the circuit 54 also includes the BYTE_input on many of the transistors. The BYTE_ signal is generated from the BYTE signal via inverter 60. When BYTE_is "0", the circuit 54 is in byte mode and only inputs IN[7:0] are active; when BYTE_ is "1", the circuit 54 is in word mode and all inputs IN[15:0] are active.

The detailed operation of the circuit 54 is as follows. When CMP is "0", transistor M52 turns on due to inverter 58 and pulls OUTPUT down so that the circuit 54 is disabled. When CMP is "1", the weak pull up transistor M53 pulls OUTPUT up and the circuit is enabled. Because transistor M53 is only a weak pull up device, OUTPUT will be pulled down if a combination of any of the other transistors in the circuit 54 turn on so as to complete a path from OUTPUT to ground. Such a path to ground will be completed if the inputs IN[15:0] are not all "0" or all "1". (assuming BYTE="0"). As long as all of the inputs IN[15:0] are all "0" or all "1", OUTPUT will remain "1". It should be noted that the inputs IN[15:0] are used as the inputs of many of the transistors in the circuit 54, and the inputs IN_[15:0] are also used as the inputs of many of the transistors in the circuit 54. An inverter 56[15:0] is used to provide the inputs IN_[15:0].

The operation of the circuit 54 will be illustrated by way of the following examples. First assume that CMP is "1" so that the circuit is enabled and that BYTE_ is "0" so that the circuit 54 is in byte mode. With BYTE_ being "0", transistors M21, M23, M25, M27, M45, M47, M49, M51 will not be able to pull OUTPUT down, and thus, the inputs IN[15:8] will have no effect on the operation of the circuit. If IN[7:0]="00000000", none of the transistors M28, M30, M32, M34, M37, M39, M41, M43 will pull OUTPUT down. For example, although transistor M37 will be turned on, transistor M36 will be turned off, preventing OUTPUT from being pulled down. Likewise, although transistor M33 will be turned on, transistor M32 will be turned off, preventing OUTPUT from being pulled down. Similarly, if IN[7:0]= "11111111", the result is the same. For example, although transistor M28 will be turned on, transistor M29 will be turned off, preventing OUTPUT from being pulled down. Likewise, although transistor M40 will be turned on, transistor M41 will be turned off, preventing OUTPUT from being pulled down. In both of these scenarios OUTPUT will remain "1" by being pulled up by transistor M53, indicating that IN[7:0] is either all "0" or all "1".

Now assume that CMP is still "1", but that BYTE_ is now "1" so that the circuit 54 is in word mode. With BYTE_ being "1", transistors M21, M23, M25, M27, M45, M47, M49, M51 will be able to pull OUTPUT down, and thus, all of the inputs IN[15:0] will have an effect on the operation of the circuit. If IN[15:0]="1000000000000000", OUTPUT will be pulled down and will be "0". This is because transistors M35, M26, M27 are all turned on, completing a path between OUTPUT and ground. Similarly, If IN[15:0]= "1111111110111111", OUTPUT will be pulled down and will be "0" because transistors M40, M41 will both be turned on. In both of these scenarios OUTPUT will be "0" indicating that IN[15:0] is not all "0" or all "1".

Referring again to FIG. 5, the purpose of the output logic 52 is to generate a number of output data bits, which is less than 16 data bits, which are arranged in a pattern which is indicative of the pattern in which the data bits of sendat [15:0] are arranged. Specifically, the output logic 52 generates the outputs CMPOUT[15:0] of the pattern recognition block 40. The outputs CMPOUT[15:8, 3:0] are generated by the inverter I9[15:8, 3:0] as follows: CMPOUT[15:8]= sendat_[15:8] and CMPOUT[3:0]=sendat_[3:0]. These two groups of bits are "do not care" in the I/O compression test mode. Specifically, as discussed above, in the I/O compression test mode the pattern recognition block 40 compresses the information in the 16 bits of sendat[15:0] down to the 4 bits CMPOUT[7:4]. Thus, the other bits in CMPOUT are not needed.

The outputs CMPOUT[7:4] are generated as follows. As a result of inverter I9[7, 4], CMPOUT[7]=sendat_[7] and CMPOUT[4]=sendat_[4] all of the time. The outputs CMPOUT[6:5], however, are determined by the states of the MATCH and CHBD signals. Specifically, when MATCH= "0" and CHBD="0", this indicates that the pattern in sendat [15:0] is not all "0", all "1", checker board or inverted checker board. In this scenario, transistor M5 will be turned off and transistor M6 will be turned on. This will cause sendat_[4] to be present at the input of inverter I12, and so CMPOUT[5]=sendat[4]. Furthermore, transistor M8 will be turned off and transistor M7 will be turned on. This will cause sendat_[4] to be present at the input of inverter I14, and so CMPOUT[6]=sendat[4].

When MATCH="1" and CHBD="0", this indicates that the pattern in sendat[15:0] is either all "0" or all "1". In this scenario, transistor M5 will be turned on and transistor M6 will be turned off. This will cause sendat[4] to be present at the input of inverter I12, and so CMPOUT[5]=sendat_[4]. Furthermore, transistor M8 will be turned off and transistor M7 will be turned on. This will cause sendat[4] to be present at the input of inverter I14, and so CMPOUT[6]=sendat_[4].

When MATCH="0" and CHBD="1", this indicates that the pattern in sendat[15:0] is either checker board or inverted checker board. In this scenario, transistor M5 will be turned off and transistor M6 will be turned on. This will cause sendat_[4] to be present at the input of inverter I12, and so CMPOUT[5]=sendat[4]. Furthermore, transistor M8 will be turned on and transistor M7 will be turned off. This will cause sendat[4] to be present at the input of inverter I14, and so CMPOUT[6]=sendat_[4].

Finally, the scenario where MATCH="1" and CHBD="1" should never occur because it is impossible for the pattern in sendat[15:0] to simultaneously be either all "0" or all "1" and either checker board or inverted checker board.

As discussed above with respect to FIG. 4, during an array read operation in the I/O compression test mode, the RDCMP signal is switched to "1" in order to turn on the pass gates M3[15:0], and the RD and RDSTAT signals are switched to "0" in order to turn off the pass gates M2[15:0], M4[15:0]. The pass gates M3[15:0] connect the output CMPOUT[15:0] to the output drivers 42[3:0], 44[7:4], 46[15:8]. During the I/O compression test mode, the enable signal OECMP is "1" and the enable signals OE and OEH are "0" so that the output driver 44[7:4] corresponding to data pins DQ[7:4] is active and the output drivers 46[15:8], 42[3:0] corresponding to data pins DQ[15:8], DQ[3:0], respectively, are tri-stated. Due to the inverter I4[7:4], the outputs DQ[7:4]=CMPOUT_[7:4].

Table 1 shows all of the possible values of the outputs DQ[7:4] in the I/O compression test mode and the corresponding values of CMPOUT[7:4], sendat[7:4], CHBD and MATCH. As shown in the last four lines of Table 1, DQ[7:4]="0101" when sendat[15:0] is in the checker board pattern, DQ[7:4]="1010" when sendat[15:0] is in the inverted checker board pattern, DQ[7:4]="0000" when sendat[15:0] is all "0", and DQ[7:4]="1111" when sendat[15:0] is all "1". DQ[7:4] will be different from these four patterns in all other cases.

TABLE 1

| MATCH | CHBD | sendat <7:4> | CMPOUT <7:4> | DQ <7:4> |
|---|---|---|---|---|
| 0 | 0 | 0000 | 1001 | 0100 |
| 0 | 0 | 0001 | 1110 | 0001 |
| 0 | 0 | 0010 | 1001 | 0110 |
| 0 | 0 | 0011 | 1110 | 0001 |
| 0 | 0 | 0100 | 1001 | 0110 |
| 0 | 0 | 0101 | 1110 | 0001 |
| 0 | 0 | 0110 | 1001 | 0110 |
| 0 | 0 | 0111 | 1110 | 0001 |
| 0 | 0 | 1000 | 0001 | 1110 |

TABLE 1-continued

| MATCH | CHBD | sendat <7:4> | CMPOUT <7:4> | DQ <7:4> |
|---|---|---|---|---|
| 0 | 0 | 1001 | 0110 | 1001 |
| 0 | 0 | 1010 | 0001 | 1110 |
| 0 | 0 | 1011 | 0110 | 1001 |
| 0 | 0 | 1100 | 0001 | 1110 |
| 0 | 0 | 1101 | 0110 | 1001 |
| 0 | 0 | 1110 | 0001 | 1110 |
| 0 | 0 | 1111 | 0110 | 1001 |
| 0 | 1 | 0101 | 1010** | 0101 |
| 0 | 1 | 1010 | 0101** | 1010 |
| 1 | 0 | 0000 | 1111** | 0000 |
| 1 | 0 | 1111 | 0000** | 1111 |

A review of Table 1 illustrates why the outputs CMPOUT[6.5] are generated in the manner shown in FIG. 5 rather than just setting CMPOUT[6:5]=sendat_[6:5]. Specifically, if all 4 output bits CMPOUT[7:4] were simply set equal to sendat_[7:4], this would sometimes lead to incorrect results. For example, in line 1 of Table 1, sendat[7:4]="0000" which, if it were used as the output CMPOUT[7:4], would imply that sendat[15:0] is all "0". However, it is clear in line 1 of Table 1 that sendat[15:0] is not all "0" because the MATCH signal is "0". Because MATCH="0", the bits in sendat[15:0] are not all "0" or all "1". Another example is seen in line 6 of Table 1 in which sendat[7:4]="0101". If this were used as the output CMPOUT[7:4], it would imply that sendat[15:0] is in the checkerboard pattern. However, it is clear in line 6 of Table 1 that sendat[15:0] is not in the checkerboard pattern because the CHBD signal is "0". Because CHBD="0", the bits in sendat[15:0] are not in the checkerboard or inverted checkerboard pattern. Similar examples are seen in lines 11 and 16 of Table 1.

As mentioned above, the pattern recognition block 40 is enabled only during an I/O compression test mode. Specifically, many integrated circuits have certain test modes of operation in which the pins take on functions tailored specifically for testing purposes. Test mode enable circuitry inside these integrated circuits generates the signals which enable the circuitry which implements each specific test mode. Such test mode enable circuitry inside the memory chips 24, 26, 28, 30 is the circuitry which will generate the appropriate states of the CMP, RDCMP and RD signals during the I/O compression test mode.

By using the teachings of the present invention, the tester 22 is able to read the memory chips 24, 26, 28, 30 in the normal read mode and no data processing is needed to verify pass or fail conditions.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A memory system operable in a normal mode of operation and a test mode of operation, comprising:
   sewning circuitry which generates x number of data bits during a read cycle;
   a detection circuit which detects a first pattern among the x number of data bits;
   an output circuit which generates y number of output data bits in reponse to the detected first pattern, which is less than the x number, which are arranged in a second pattern which is indicative of the first pattern detected by the detection circuit; and a read path circuit, coupled to the sag circuitry, the detection circuit and the output circuit, which transfers the x number of data bits to x number of output nodes in a first read cycle operating in the normal mode of operation and which transfers the y number of output data bits to y number of output nodes in a second read cycle operating in the test mode of operation.

2. A memory system in accordance with claim 1, wherein the first pattern detected by the detection circuit is a pattern in which two adjacent bits in the x number of data bits are identical.

3. A memory system in accordance with claim 1, wherein the first pattern detected by the detection circuit is a pattern in which every two adjacent bits in the x number of data bits are identical.

4. A memory system in accordance with claim 1, wherein the first pattern detected by the detection circuit is a pattern in which two adjacent bits in the x number of data bits are different.

5. A memory system in accordance with claim 1, wherein the first pattern detected by the detection circuit is a pattern in which each two adjacent bits in the x number of data bits are different.

6. A memory system in accordance with claim 1, wherein the read path circuit further comprises:
x number of output drivers corresponding to the x number of data bits generated by the sensing circuitry, wherein during the second read cycle in the test mode of operation only y number of the x number of output drivers are enabled and are used to transfer the y number of output data bits generated by the output circuit to y number of the x number of output nodes.

7. A memory system operable in a normal mode of operation and a test mode of operation, comprising:
sensing circuitry which generates x number of data bits during a read cycle;
a read path circuit, coupled to the sensing circuitry, which transfers the x number of data bits generated by the sensing circuitry during a first read cycle in the normal mode of operation to x number of output nodes;
a detection circuit, coupled to the read path circuit, which detects a first pattern among the x number of data bits generated by the sensing circuitry during a second read cycle in the test mode of operation; and
an output circuit, coupled to the detection circuit, which generates y number of output data bits, which is less than the x number, which are arranged in a second pattern which is indicative of the first pattern detected by the detection circuit during the second read cycle in the test mode of operation.

8. A memory system in accordance with claim 7, wherein the first pattern detected by the detection circuit is a pattern in which two adjacent bits in the x number of data bits are identical.

9. A memory system in accordance with claim 7, wherein the first pattern detected by the detection circuit is a pattern in which two adjacent bits in the x number of data bits are different.

10. A memory system in accordance with claim 7, wherein the read path circuit further comprises:
x number of output drivers corresponding to the x number of data bits generated by the sensing circuitry, wherein during the second read cycle in the test mode of operation only y number of the x number of output drivers are enabled and are used to transfer the y number of output data bits generated by the output circuit to y number of the x number of output nodes.

11. A memory system operable in a normal mode of operation and a test mode of operation, comprising:
sensing circuitry which generates x number of data bits during a read cycle;
read path means for transferring the x number of data bits generated by the sensing circuitry to x number of output nodes during a read cycle in the normal mode of operation;
detection means for detecting a first pattern among the x number of data bits generated by the sensing circuitry during a read cycle in the test mode of operation; and
output means for generating y number of output data bits in response to the detected first pattern, which is less than the x number, which are arranged in a second pattern which is indicative of the first pattern in which the x number of data bits are arranged.

12. A memory system in accordance with claim 11, wherein the first pattern detected by the detection means is a pattern in which two adjacent bits in the x number of data bits are identical.

13. A memory system in accordance with claim 11, wherein the first pattern detected by the detection means is a pattern in which every two adjacent bits in the x number of data bits are identical.

14. A memory system in accordance with claim 11, wherein the first pattern detected by the detection means is a pattern in which two adjacent bits in the x number of data bits are different.

15. A memory system in accordance with claim 11, wherein the first pattern detected by the detection means is a pattern in which each two adjacent bits in the x number of data bits are different.

16. A memory system in accordance with claim 11, wherein the read path means further comprises:
x number of output drivers corresponding to the x number of data bits generated by the sensing circuitry, wherein during a read cycle in the test mode of operation only y number of the x number of output drivers are enabled and are used to transfer the y number of output data bits generated by the output means to y number of the x number of output nodes.

17. A pattern recognition circuit, comprising:
a first detection circuit which detects whether or not a set of x number of data bits are arranged in a pattern in which all of the x number of data bits are identical and which generates a MATCH signal in response thereto; and
an output circuit, coupled to receive the MATCH signal, which generates y number of output data bits which are arranged in a pattern indicative of whether the set of x data bits are identical or are arranged in another pattern, wherein the y number is less than the x number.

18. A pattern recognition circuit in accordance with claim 17, further comprising:
a second detection circuit which detects whether or not the set of x number of data bits are arranged in a pattern in which each two adjacent bits in the x number of data bits are different and for generating a CHBD signal in response thereto;
wherein the output circuit is coupled to receive the CHBD signal and the generated y number of output data bits are arranged in a pattern indicative of whether the set of x data bits are arranged in a pattern in which each two adjacent bits are different.

19. A pattern recognition circuit in accordance with claim 17, further comprising:

x number of output drivers corresponding to the x number of data bits and coupled to the output circuit, wherein during a test mode of operation only y number of the x number of output drivers are enabled and are used to transfer the y number of output data bits to y number of output nodes.

20. A method of testing an integrated circuit (IC) memory, comprising the steps of:

reading x number of outputs of sensing circuitry in the IC memory so that x number of data bits are read;

detecting a first pattern among the x number of data bits which are read; and generating a y number of output data bits in response to the first pattern which is less than the x number and which are arranged in a second pattern which is indicative of the first pattern among the x number of data bits.

21. A method of testing an integrated circuit in accordance with claim 20, wherein the step of detecting a first pattern comprises the steps of:

detecting whether or not the x number of data bits are arranged in a pattern in which all bits are identical; and detecting whether or not the x number of data bits are arranged in a pattern in which each two adjacent bits are different.

22. A method of testing an integrated circuit in accordance with claim 21, further comprising the steps of:

generating a MATCH signal in response to the x number of data bits being arranged in a pattern in which all bits are identical; and generating a CHBD signal in response to the x number of data bits being arranged in a pattern in which each two adjacent bits are different.

23. A method of testing an integrated circuit in accordance with claim 22, wherein the step of generating a y number of output data bits comprises the steps of:

generating a first one of the y number of data bits y1 by inverting a corresponding one of the x number of data bits x1; and generating a second one of the y number of data bits y2 which is adjacent to y1 by setting y2 equal to an inversion of x1 if the MATCH signal indicates that all bits are identical and setting y2 equal to x1 if the MATCH signal indicates that all bits are not identical.

24. A method of testing an integrated circuit in accordance with claim 23, wherein the step of generating a y number of output data bits further comprises the step of:

generating a third one of the y number of data bits y3 which is adjacent to y2 by setting y3 equal to an inversion of x1 if the CHBD signal indicates that the x number of data bits are arranged in a pattern in which each two adjacent bits are different and setting y3 equal to x1 if the CHBD signal indicates that the x number of data bits are not arranged in a pattern in which each two adjacent bits are different and the MATCH signal indicates that all bits are not identical.

25. A method of testing an integrated circuit in accordance with claim 20, further comprising the step of:

enabling only a y number of an x number of output drivers used to transfer the y number of output data bits to a y number of output nodes.

26. A method of testing an integrated circuit (IC) memory, comprising the steps of:

reading x number of outputs of sensing circuitry in the IC memory so that x number of data bits are read;

detecting whether or not the x number of data bits are arranged in a first pattern in which all bits are identical;

detecting whether or not the x number of data bits are arranged in a second pattern in which each two adjacent bits are different; and generating a y number of output data bits in response to said detecting steps, which is less than the x number and which are arranged in a third pattern which is indicative of whether the x number of data bits are identical, are arranged in a pattern in which each two adjacent bits are different, or are arranged in another pattern.

27. A method of testing an integrated circuit in accordance with claim 26, further comprising the steps of:

transferring the x number of data bits to x number of output nodes in a first read cycle operating in a normal mode of operation; and transferring the y number of output data bits to y number of output nodes in a second read cycle operating in a test mode of operation.

28. A method of testing an integrated circuit in accordance with claim 27, wherein the step of transferring the y number of output data bits to y number of output nodes comprises the step of:

enabling only a y number of an x number of output drivers which are used to transfer the y number of output data bits to the y number of output nodes.

29. A memory system operable in a normal mode of operation and a test mode of operation, comprising;

sensing circuitry which generates x number of data bits during a read cycle;

a detection circuit which detects a fist pattern among the x number of data bits;

an output circuit which generates y number of output data bits in response to the first pattern, which is less than the x number, which are arranged in a second pattern which is indicative of the first pattern detected by the detection circuit; and x number of output drivers corresponding to the x number of data bits generated by the sensing circuitry, wherein during the test mode of operation only y number of the x number of output drivers are enabled and are used to transfer the y number of output data bits to y number of output nodes.

30. A memory system in accordance with claim 29, wherein the first pattern detected by the detection circuit is a pattern in which two adjacent bits in the x number of data bits are identical.

31. A memory system in accordance with claim 29, wherein the first pattern detected by the detection circuit is a pattern in which every two adjacent bits in the x number of data bits are identical.

32. A memory system in accordance with claim 29, wherein the first pattern detected by the detection circuit is a pattern in which two adjacent bits in the x number of data bits are different.

33. A memory system in accordance with claim 29, wherein the first pattern detected by the detection circuit is a pattern in which each two adjacent bits in the x number of data bits are different.

34. A memory test system, comprising:

a memory tester;

a plurality of memories coupled to the memory tester, each of the memories comprising:

x number of output nodes;

sensing circuitry configured to generate x number of data bits; and a compression circuit operatively coupled to the sensing circuitry and configured to detect a first pattern among the x number of data bits and to compress the first pattern to a lower y number of output bits arranged in a pattern so that data represented by the x number of data bits can be represented on only y number of the x number of output nodes.

35. A memory test system in accordance with claim 34, further comprising:

an output circuit operatively coupled to the compression circuit and comprising x number of output drivers of which during a test mode of operation only y number of the x number of output drivers are enabled and are used to transfer the y number of output bits to the y number of the x number of output nodes.

* * * * *

UNITED STATES PATENT AND TRADEMARK OFFICE
CERTIFICATE OF CORRECTION

PATENT NO. : 6,016,561
DATED : January 18, 2000
INVENTOR(S) : RoohParvar et al.

It is certified that error appears in the above-indentified patent and that said Letters Patent is hereby corrected as shown below:

In column 8, line 30, delete "remains at Each of the detection" and insert
--remains at "0".
Each of the detection--, therefor.
In column 12, line 59, delete "sewning" and insert --sensing--, therefor.
In column 13, line 1, delete "sag" and insert --sensing--, therefor.
In column 16, line 12, delete "which arc" and insert --which are--, therefor.

Signed and Sealed this

Sixth Day of March, 2001

*Attest:*

NICHOLAS P. GODICI

*Attesting Officer*   Acting Director of the United States Patent and Trademark Office